(12) United States Patent
Li

(10) Patent No.: US 6,768,641 B2
(45) Date of Patent: Jul. 27, 2004

(54) HEAT DISSIPATION ASSEMBLY

(75) Inventor: Yue-June Li, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/338,424

(22) Filed: Jan. 7, 2003

(65) Prior Publication Data

US 2004/0001315 A1 Jan. 1, 2004

(30) Foreign Application Priority Data

Jun. 28, 2002 (TW) ...................................... 91209767 U

(51) Int. Cl.⁷ ............................................... H05K 7/20
(52) U.S. Cl. ........................ 361/719; 24/457; 24/458; 248/510; 257/719; 257/722; 165/80.3; 165/121; 165/185; 361/695; 361/697; 361/703; 361/710; 361/704
(58) Field of Search .................. 24/296–297, 457–458; 165/80.2–80.3, 121–122, 126, 185; 257/718–719, 726–727, 722; 248/505, 510; 361/687, 694–695, 697, 704–710, 719–721

(56) References Cited

U.S. PATENT DOCUMENTS

| | | | | |
|---|---|---|---|---|
| 5,448,449 A | * | 9/1995 | Bright et al. ............... | 361/704 |
| 5,590,025 A | * | 12/1996 | Clemens ..................... | 361/695 |
| 5,771,155 A | * | 6/1998 | Cook .......................... | 361/710 |
| 5,808,236 A | * | 9/1998 | Brezina et al. ............ | 174/16.3 |
| 5,973,921 A | * | 10/1999 | Lin ............................. | 361/695 |
| 6,181,556 B1 | * | 1/2001 | Allman ....................... | 361/690 |
| 6,304,445 B1 | * | 10/2001 | Bollesen .................... | 361/697 |
| 6,415,853 B1 | * | 7/2002 | Tao et al. .................. | 165/80.3 |
| 6,496,368 B2 | * | 12/2002 | Jui-Yuan .................... | 361/697 |

FOREIGN PATENT DOCUMENTS

| | | |
|---|---|---|
| TW | 361654 | 6/1999 |
| TW | 389342 | 5/2000 |
| TW | 454553 | 1/2002 |

* cited by examiner

Primary Examiner—Gregory D Thompson
(74) Attorney, Agent, or Firm—Wei Te Chung

(57) ABSTRACT

A heat dissipation assembly for dissipating heat from a CPU (60) mounted to a PCB (70) includes a heat sink (40), two wire clips (30), a fixing frame (20) secured to the heat sink, and a fan (10) attached to the fixing frame. Two grooves (402) are defined in the heat sink. Each clip has a central portion (302) received in a corresponding groove, and two arms (304) extending from the central portion. A hook (306) is formed at an end of each arm. An offset part is formed at the central portion, for limiting rotation of the clip in the groove. The fixing frame includes a top wall (212) and two side walls (202). Two cutouts (206) are defined in each side wall, corresponding to the grooves of the heat sink. Opposite ends of the central portion of each clip protrude out through corresponding cutouts of the fixing frame.

17 Claims, 3 Drawing Sheets

HEAT DISSIPATION ASSEMBLY

BACKGROUND OF THE INVENTION

1. Field of the Invention

The present invention relates to heat dissipation assemblies, and particularly to heat dissipation assemblies which are conveniently assembled prior to transportation and use.

2. Related Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat dissipation assemblies are frequently used to dissipate heat from these electronic devices.

Typically, a clip is used to attach a heat sink to an electronic device. The clip is usually integrally formed from a sheet of plastic or steel material. Examples of such heat sink clips are disclosed in U.S. Pat. No. 6,343,015, and Taiwan Patent Application No. 89216225. However, these clips are relatively wide, which requires more base material and thus increases costs. Furthermore, in use, the clip is conventionally disposed in a center of the heat sink. The clip occupies space that would otherwise be occupied by one or more extra heat dissipation fins or heat dissipation pins. Thus the heat dissipation capability of the heat sink is compromised.

Wire clips have been devised to overcome the above-described shortcomings. Examples of such heat sink clips are disclosed in Taiwan Patent Applications Nos. 87218992 and 87205513. In each disclosure, the clip forms part of an assembly that includes a heat sink. The clip is a separate part that must be individually packed and transported prior to assembly and use. This is inconvenient, and unduly inflates costs. Furthermore, in assembly, the procedure is unduly complicated, and operating space available for manipulation of the clip is limited. This is particularly inefficient for mass production runs.

Thus, an improved heat dissipation assembly which overcomes the above-mentioned problems is desired.

BRIEF SUMMARY OF THE INVENTION

Accordingly, an object of the present invention is to provide a heat dissipation assembly which is conveniently assembled prior to transportation and use.

Another object of the present invention is to provide a heat dissipation assembly having wire clips which are easily and inexpensively made, and which occupy minimal space on a heat sink of the heat dissipation assembly.

Still another object of the present invention is to provide a heat dissipation assembly having a pair of wire clips which can securely attach a heat sink to an electronic package.

To achieve the above-mentioned objects, a heat dissipation assembly of the present invention is for dissipating heat from a central processing unit (CPU) mounted on a printed circuit board (PCB). The heat dissipation assembly comprises a heat sink, two wire clips, a fixing frame, and a fan attached to the fixing frame. Two grooves are transversely defined through fins of the heat sink. Each clip has a central portion received in a corresponding groove, and two arms extending from the central portion. A hook is formed at a distal end of each arm. An offset part is formed at the central portion, for limiting rotation of the clip in the groove. The fixing frame is secured to the heat sink, and comprises a top wall and two side walls depending from the top wall. Two cutouts are defined in a lower portion of each side wall, corresponding to the grooves of the heat sink. Opposite ends of the central portion of each clip protrude out through corresponding cutouts of the fixing frame. The clips are held in the heat sink prior to transportation and use of the heat dissipation assembly.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
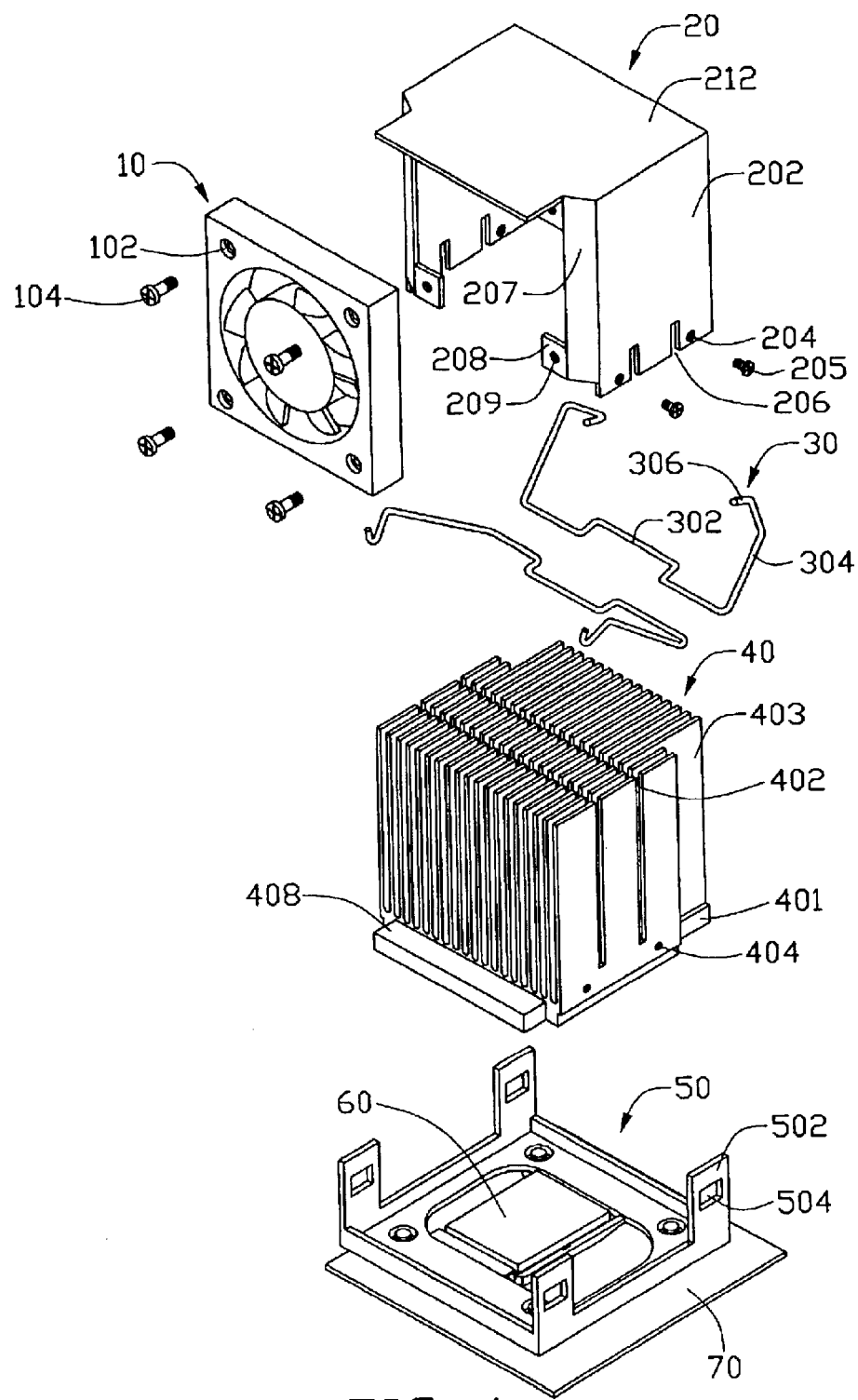
FIG. 1 is an exploded, isometric view of a heat dissipation assembly in accordance with the present invention, together with a CPU and a surrounding retention module mounted on a PCB.

Referring to FIG. 1, a heat dissipation assembly in accordance with the present invention comprises a fan 10, a fixing frame 20, a pair of wire clips 30, a heat sink 40 and a retention module 50. An electronic package 60 such as a central processing unit (CPU) 60 is attached to a printed circuit board (PCB) 70. The retention module 50 is mounted to the PCB 70 by conventional means, and comprises a rectangular chassis surrounding the CPU 60. The retention module 50 further comprises four posts 502 extending upwardly from four corners of the chassis respectively. A locking hole 504 is defined in an upper portion of each post 502.

The heat sink 40 has a base 401, and a plurality of parallel fins 403 extending upwardly from the base 401. A horizontal supporting plate 408 is formed at one side of the base 401, for supporting the fan 10 thereon. Two parallel grooves 402 are transversely defined through the plurality of fins 403, for accommodating the wire clips 30 therein. Two threaded holes 404 are defined in a lower portion of each of two outmost fins 403 that are at opposite sides of the heat sink 40 respectively. At each outmost fin 403, the threaded holes 404 are generally at respective opposite sides of the grooves 402.

Each wire clip 30 is integrally made from a single piece of spring steel wire. The wire clip 30 comprises a central portion 302, and two spring arms 304 extending perpendicularly in a same direction from opposite ends of the central portion 302 respectively. A middle part of the central portion 302 is offset from and parallel to remaining parts of the central portion 302. A distance of such offset is greater than a width of either of the grooves 402 of the heat sink 40. A distal end of each spring arm 304 is bent inwardly to form a hook 306.

The fan 10 is generally parallelepiped, and defines four through apertures 102 in four corners thereof respectively. Four screws 104 are for attaching the fan 10 to the fixing frame 20.

The fixing frame 20 comprises a top plate 212, and two side plates 202 depending from the opposite sides of the top plate 212 respectively. A vertical slanted flange 207 is bent inwardly from one side edge of each side plate 202. The slanted flanges 207 symmetrically oppose each other across the fixing frame 20. Two fixing tabs 208 extend inwardly from top and bottom ends respectively of each flange 207. Each fixing tab 208 defines a threaded aperture 209 therein, corresponding to a respective one of the through apertures 102 of the fan 10. Two through holes 204 are defined in a bottom portion of each side plate 202, corresponding to two respective threaded holes 404 of the heat sink 40. Two cutouts 206 are defined in the bottom portion of each side plate 202 between the through holes 204, corresponding to the grooves 402 of the heat sink 40. Four screws 205 are for attaching the fixing frame 20 to the heat sink 40.

Figure 2:
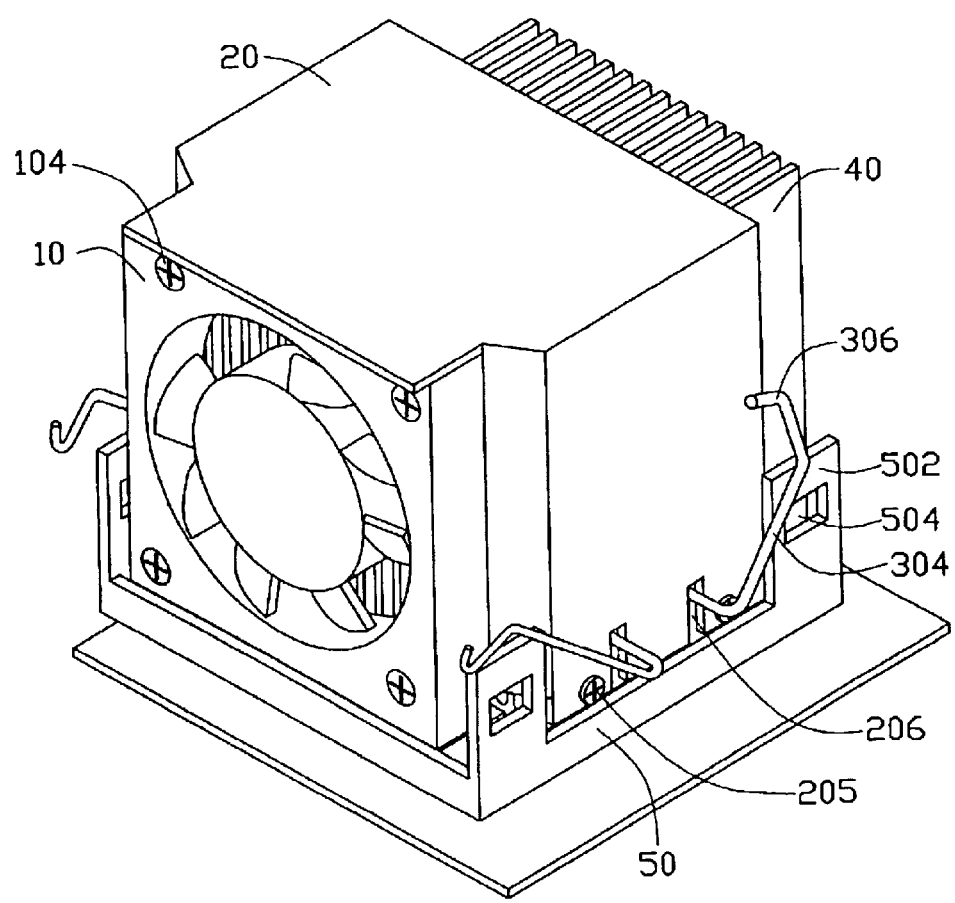
FIG. 2 is a partly assembled view of FIG. 1, showing clips of the heat dissipation assembly prior to their attachment to the retention module.
Figure 3:
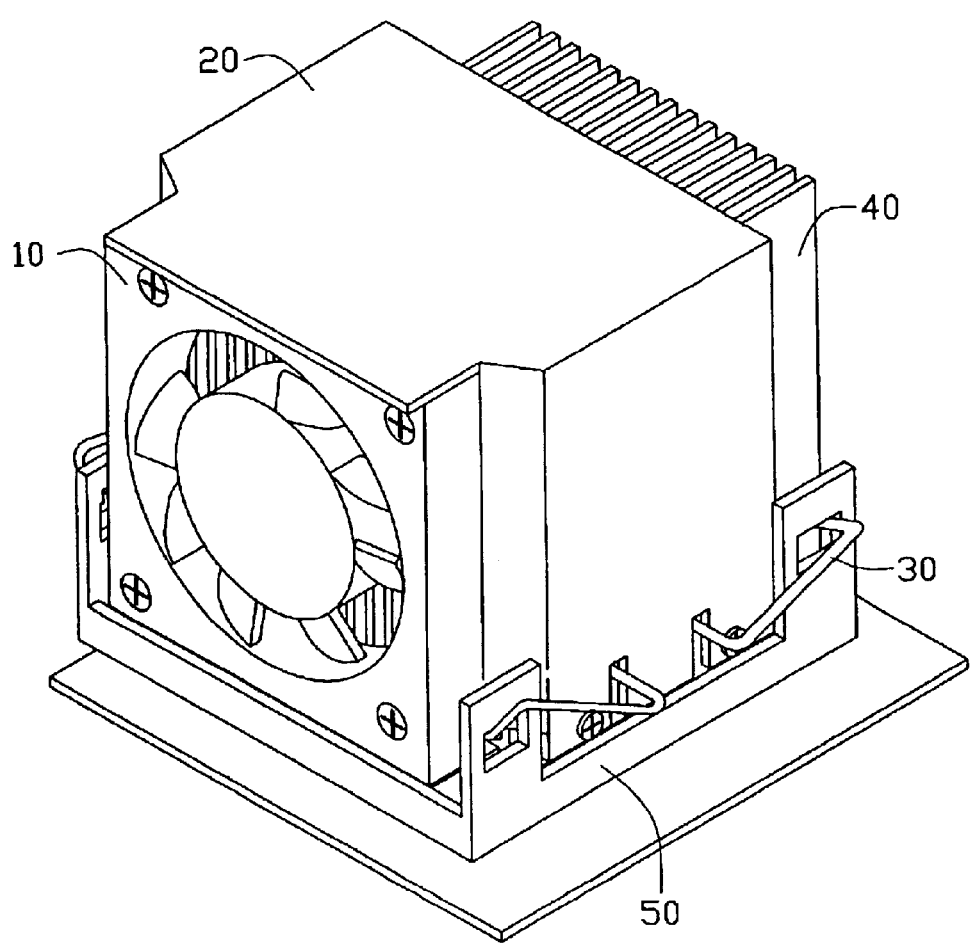
FIG. 3 is a fully assembled view of FIG. 1, showing the clips of the heat dissipation assembly attached to the retention module.

Referring also to FIGS. 2 and 3, in assembly, the fan 10 is attached to the fixing frame 20. The screws 104 are extended through the through apertures 102 of the fan 10 and engaged in the threaded apertures 209 of the fixing tabs 208 of the fixing frame 20. Then the central portions 302 of the clips 30 are placed into the grooves 402 of the heat sink 40. The offset part of the central portion 302 of each clip 30 can limit an angle of rotation of the clip 30 in the corresponding groove 402. The spring arms 304 of each clip 30 extend inclinedly upwardly alongside respective outmost fins 403 of the heat sink 40. The combined fixing frame 20 and fan 10 is then placed over the heat sink 40. The fan 10 is supported by the support plate 408 of the heat sink 40. The side plates 202 of the fixing frame 20 abut respective outmost fins 403 of the heat sink 40. Opposite ends of the central portion 302 of each clip 30 protrude out through corresponding cutouts 206 of the fixing frame 20. The spring arms 304 of each clip 30 extend inclinedly upwardly alongside respective side plates 202 of the heat sink 40. The screws 205 are extended through the through holes 204 of the fixing frame 20 and engaged in the threaded holes 404 of the heat sink 40. The fixing frame 20 is thus secured to the heat sink 40 to form the heat dissipation assembly. The clips 30 are held in the heat sink 40 prior to use of the heat dissipation assembly.

In use, the heat dissipation assembly is placed onto the CPU 60. The base 401 of the heat sink 40 contacts the CPU 60. The spring arms 304 of the clips 30 are depressed so that the hooks 306 of the spring arms 304 are resiliently engaged in the locking holes 504 of the retention module 50. Thus, the heat dissipation assembly is firmly and securely attached to the CPU 60.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat dissipation assembly for dissipating heat from an electronic package that is mounted on a circuit board, the heat dissipation assembly comprising:
   a heat sink adapted to be attached on the electronic package, the heat sink defining at least one groove therein;
   at least one clip adapted to secure the heat sink on the electronic package, the at least one clip comprising a central portion having a restraining means received in the at least one groove of the heat sink, and two arms extending from the central portion;
   a fixing frame secured to the heat sink, the fixing frame comprising two side plates and a connecting plate connecting the side plates, at least one cutout defined in a lower portion of each of the side plates corresponding to the at least one groove, whereby the arms of the at least one clip are exposed outside the fixing frame which holds the at least one clip in the at least one groove; and
   a fan secured to the fixing frame.

2. The heat dissipation assembly as described in claim 1, wherein the heat sink further comprises a plurality of parallel fins, and the at least one groove is transversely defined through the fins.

3. The heat dissipation assembly as described in claim 1, wherein the at least one clip is integrally made from a single piece of spring wire.

4. The heat dissipation assembly as described in claim 3, wherein the restraining means limits rotation of the at least one clip in the groove.

5. The heat dissipation assembly as described in claim 4, wherein the restraining means of the central portion is offset relative to a remainder of the central portion, and a distance of such offset is greater than a width of the at least one groove of the heat sink.

6. The heat dissipation assembly as described in claim 1, wherein the arms extend substantially perpendicularly from opposite ends of the central portion, and extend inclinedly upwardly alongside respective side plates of the fixing frame.

7. The heat dissipation assembly as described in claim 1, wherein a hook is inwardly formed at a distal end of each of the spring arms of the at least one clip, for engaging with a retention module on the circuit board.

8. The heat dissipation assembly as described in claim 1, wherein the fixing frame is secured to the heat sink by a plurality of fasteners.

9. A heat dissipation assembly for dissipating heat from an electronic package that is mounted to a circuit board, the heat dissipation assembly comprising:
   a heat sink adapted to be attached on the electronic package, the heat sink having at least one groove defined therein;
   at least one wire clip adapted to secure the heat sink to the electronic package, the at least one wire clip having a central portion received in the at least one groove, and two spring arms extending from opposite ends of the central portion; and
   a fixing frame secured to the heat sink, the fixing frame having at least one side wall adjacent to one side of the heat sink, at least one cutout defined in a lower portion of the at least one side wall corresponding to the at least one groove of the heat sink, for restraining the at least one wire clip, whereby the at least one wire clip is held in the heat sink prior to the heat dissipation assembly being assembled to the electronic package.

10. The heat dissipation assembly as described in claim 9, the central portion has a restraining part to limit rotation of the central portion in the at least one groove.

11. The heat dissipation assembly as described in claim 10, further comprising a fan attached to the fixing frame.

12. The heat dissipation assembly as described in claim 10, wherein the at least one wire clip is integrally made from a single piece of spring wire.

13. The heat dissipation assembly as described in claim 10, wherein the restraining part of the central portion is offset relative to a remainder of the central portion, and a distance of such offset is greater than a width of the at least one groove of the heat sink.

14. The heat dissipation assembly as described in claim 10, wherein a hook is formed at a distal end of each of the spring arms of the at least one wire clip.

15. The heat dissipation assembly as described in claim 10, wherein the spring arms and two opposite outer parts of the central portion are exposed outside the at least one groove, and the at least one cutout receiving a corresponding outer part of the central portion thereby holding the at least one wire clip in the heat sink.

16. The heat dissipation assembly as described in claim 9, wherein the clip is held with the heat sink by cooperation of the groove and the cutout.

17. A heat dissipation assembly comprising:

a printed circuit board;

an electronic package sub-assembly mounted on the printed circuit board;

a retention module mounted on the printed circuit board and surrounding said electronic package assembly;

a heat sink having thereof a base seated upon the electronic package sub-assembly and defining a groove therein and across the base;

a fixing frame secured to the heat sink and defining a cutout in alignment with the groove along a longitudinal direction of the groove; and an elongated clip including one end section locked to the retention module, and a center section having a restraining means received in the groove and downwardly pressing against the base.

* * * * *